(12) United States Patent
Liu et al.

(10) Patent No.: US 12,520,619 B2
(45) Date of Patent: Jan. 6, 2026

(54) INTERDIGITATED BACK CONTACT CELL AND MANUFACTURING METHOD THEREOF

(71) Applicant: Trina Solar Co., Ltd., Jiangsu (CN)

(72) Inventors: Wei Liu, Jiangsu (CN); Yunyun Hu, Jiangsu (CN); Zhiyuan Liu, Jiangsu (CN); Daming Chen, Jiangsu (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 18/780,244

(22) Filed: Jul. 22, 2024

(65) Prior Publication Data
US 2025/0143009 A1    May 1, 2025

(30) Foreign Application Priority Data
Oct. 25, 2023    (CN) .......................... 202311390094.3

(51) Int. Cl.
| | | |
|---|---|---|
| *H10F 77/20* | (2025.01) | |
| *H10F 71/00* | (2025.01) | |
| *H10F 77/1223* | (2025.01) | |

(52) U.S. Cl.
CPC ......... *H10F 77/227* (2025.01); *H10F 71/129* (2025.01); *H10F 77/1223* (2025.01)

(58) Field of Classification Search
None
See application file for complete search history.

(56) References Cited

FOREIGN PATENT DOCUMENTS

KR    102053140 B1 * 12/2019 ......... H10F 77/1662

OTHER PUBLICATIONS

English language machine translation of KR102053140-B1. (Year: 2025).*
Examination Report dated Aug. 12, 2025, for Australian Patent Application No. 2024216358.
Extended European Search Report dated Dec. 10, 2024, for European Patent Application No. 24186737.3.
Notification to Grant Patent Right for Invention dated Jul. 29, 2024, for Chinese Patent Application No. 202311390094.3.

* cited by examiner

*Primary Examiner* — Eli S Mekhlin
(74) *Attorney, Agent, or Firm* — Renner, Otto, Boisselle & Sklar, LLP

(57) ABSTRACT

The present disclosure provides an interdigitated back contact cell and a manufacturing method thereof. The interdigitated back contact cell includes: a substrate including a front side and a back side, the front side being arranged opposite to the back side; where, along a first direction, first functional regions and second functional regions are alternately arranged on the back side of the substrate; an isolation region is arranged between every adjacent first functional region and second functional region; and the first emitter is spatially isolated from one adjacent second emitter by a corresponding isolation region; and the first diffusion layer is in contact with at least one adjacent second diffusion layer in a corresponding region of a corresponding isolation region. The interdigitated back contact cell provided by the present disclosure has a lower reverse breakdown voltage, a high component reliability, and a high cell efficiency.

20 Claims, 9 Drawing Sheets

INTERDIGITATED BACK CONTACT CELL AND MANUFACTURING METHOD THEREOF

CROSS-REFERENCE TO RELATED APPLICATIONS

This application claims the priority of Chinese Patent Application No. 202311390094.3, submitted to the Chinese Intellectual Property Office on Oct. 25, 2023, the disclosure of which is incorporated herein in its entirety by reference.

TECHNICAL FIELD

The present disclosure belongs to the technical field of the cells, and relates to an interdigitated back contact cell and a manufacturing method thereof.

BACKGROUND

The interdigitated back contact (IBC) cell has both the emitter and the collector on the back side of the cell, in which, electron-hole pairs are generated in the bulk region with a high lifetime, and the electron-hole pairs are collected in the emitter and the collector on the back side of the cell. The metal on the back side of the cell is connected with the emitter and the collector through the P-type metal contact point and the N-type metal contact point respectively; and the metal pattern is arranged on the front side of the cell, to avoid blocking light, thereby improving the absorption effect of the light. Furthermore, most of the area on the back side of the cell can be covered by the metal pattern, so the series resistance of the metal pattern is very low. In addition, most of the area on the back side is covered by the metal pattern, which also helps to reflect light from the back side of the cell.

In the conventional IBC cell, in order to reduce the increased recombination caused by the contact region between the P-doped region and the N-doped region, a trench isolation structure is often arranged to separate the P-doped region from the N-doped region, and the trench isolation structure has a high reverse breakdown voltage and is at risk of hot spots.

SUMMARY

The present disclosure aims to provide an interdigitated back contact cell and a manufacturing method thereof. The interdigitated back contact cell provided by the present disclosure has a high cell efficiency and an excellent reverse breakdown voltage, and the cell component has a high reliability.

In order to achieve the aim of the present disclosure, an overview of the subject described in detail in the present disclosure is provided below.

A first aspect of the present disclosure provides an interdigitated back contact cell. The interdigitated back contact cell includes:

a substrate including a front side and a back side, the front side being arranged opposite to the back side; where along a first direction, first functional regions and second functional regions are alternately arranged on the back side of the substrate; the first direction intersects with a thickness direction of the substrate;

along a direction far away from the substrate, each of the first functional regions includes a first diffusion layer, a first dielectric layer, a first emitter, and a first electrode which are stacked;

along the direction far away from the substrate, each of the second functional regions includes a second diffusion layer, a second dielectric layer, a second emitter, and a second electrode which are stacked;

an isolation region is arranged between every adjacent first functional region and second functional region, and the first emitter is spatially isolated from one adjacent second emitter by a corresponding isolation region; and the first diffusion layer is in contact with at least one adjacent second diffusion layer in a corresponding region of a corresponding isolation region.

In the present disclosure, the front side of the substrate is the front side of the interdigitated back contact cell, namely the receiving side of sunlight; the back side of the substrate is the back side of the interdigitated back contact cell. The interdigitated back contact cell provided by the present disclosure also includes a frontside passivation layer on the front side of the substrate, which is not specifically limited in the present disclosure.

In the interdigitated back contact cell provided by the embodiments of the present disclosure, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell. Moreover, the interdigitated back contact cell provided by the present disclosure has an excellent reliability and a high cell efficiency.

In the present disclosure, the first functional region and the second functional region are alternately arranged along the first direction on the back side of the substrate; that is, under the non-edge condition, one first functional region is adjacent to two second functional regions, and one second functional region is adjacent to two first functional regions. In the present disclosure, "the first diffusion layer is in contact with at least one adjacent second diffusion layer" means that the first diffusion layer is in contact with one adjacent second diffusion layer and is spatially isolated from another adjacent second diffusion layer; or, the first diffusion layer is in contact with both of adjacent second diffusion layers.

In the present disclosure, "the first direction intersects with the thickness direction of the substrate" means that the alternating extension direction of the first functional region and the second functional region intersects with the thickness direction of the substrate. In some embodiments, the first direction may be perpendicular to the thickness direction of the substrate.

The substrate of the interdigitated back contact cell provided by the present disclosure is a conventional doped monocrystalline silicon substrate of an IBC cell in the art, which is not specifically limited in the present disclosure.

A thickness of the first diffusion layer is from 20 nm to 100 nm, and a thickness of the second diffusion layer is from 20 nm to 100 nm.

A thickness of a contact region between the first diffusion layer and the second diffusion layer is less than or equal to the thickness of the first diffusion layer.

A width of the isolation region is from 1 μm to 100 μm.

A passivation layer is arranged on surfaces of the first emitter, the isolation region and the second emitter;

the first electrode passes through the passivation layer and comes into contact with the first emitter;

the second electrode passes through the passivation layer and comes into contact with the second emitter.

A material of the first emitter is doped polysilicon, a material of the second emitter is doped polysilicon;

a material of the first diffusion layer is doped crystalline silicon, and a material of the second diffusion layer is doped crystalline silicon.

A thickness of the first dielectric layer is from 1 nm to 2 nm, and a thickness of the second dielectric layer is from 1 nm to 2 nm.

A thickness of the first emitter is from 200 nm to 400 nm; and a thickness of the second emitter is from 200 nm to 400 nm.

Another aspect of the embodiments of the present disclosure provides a method for manufacturing an interdigitated back contact cell. The method for manufacturing an interdigitated back contact cell includes:

forming, on a back side of a substrate, first functional regions and second functional regions which are alternately arranged along a first direction; wherein, the first direction intersects with a thickness direction of the substrate; along a direction far away from the substrate, each of the first functional regions includes a first diffusion layer, a first dielectric layer, a first emitter and a first electrode which are stacked; along the direction far away from the substrate, each of the second functional regions includes a second diffusion layer, a second dielectric layer, a second emitter and a second electrode which are stacked;

forming an isolation region between every adjacent first functional region and second functional region; wherein, the first emitter is spatially isolated from one adjacent second emitter by a corresponding isolation region; and the first diffusion layer is in contact with at least one adjacent second diffusion layer in a corresponding region of a corresponding isolation region.

The method for manufacturing an interdigitated back contact cell provided by the embodiments of the present disclosure has a simple process. In the interdigitated back contact cell produced by the manufacturing method, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell.

A doping polarity of the first diffusion layer is the same as a doping polarity of the first emitter;

a doping polarity of the second diffusion layer is the same as a doping polarity of the second emitter;

and the doping polarity of the first emitter is opposite to the doping polarity of the second emitter.

In the present disclosure, the interdigitated back contact cell in the first aspect can be manufactured by the method for manufacturing an interdigitated back contact cell provided in the second aspect.

The technical scheme of the present disclosure has the following beneficial effects.

(1) In the interdigitated back contact cell provided by the present disclosure, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell. Moreover, the interdigitated back contact cell provided by the present disclosure has an excellent reliability and a high cell efficiency.

(2) The method for manufacturing an interdigitated back contact cell provided by the present disclosure has a simple process. And the reverse breakdown voltage of the interdigitated back contact cell formed by the manufacture method is reduced to a reasonable value, thereby avoiding the risk of hot spots, and having a higher cell efficiency.

Figure 1:
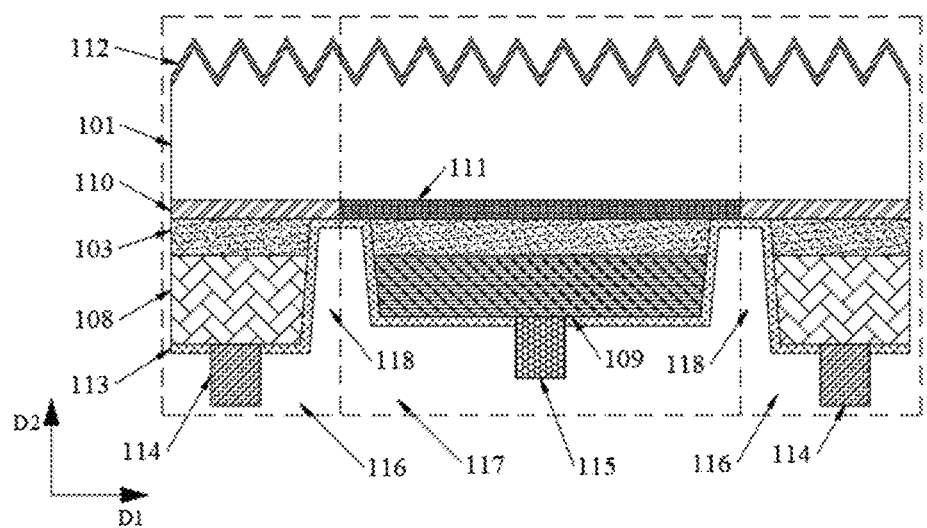
FIG. 1 is a schematic diagram of an interdigitated back contact cell according to an embodiment of the present disclosure.

REFERENCE NUMERAL 101, substrate; 102, mask layer; 103, tunneling layer; 104, intrinsic microcrystalline amorphous mixed layer; 105, doped film layer; 106, first protective film layer; 107, second protective film layer; 108, first emitter; 109, second emitter; 110, first diffusion layer; 111, second diffusion layer; 112, frontside passivation layer; 113, passivation layer; 114, first electrode; 115, second electrode; 116, first functional region; 117, second functional region; 118, first isolation region; 119, second isolation region;

D1, first direction; D2, thickness direction of the substrate.

DETAILED DESCRIPTION

The technical solutions in the embodiments of the present disclosure are described below clearly and completely referring to the accompanying drawings in the embodiments of the present disclosure. Apparently, the present disclosure is understandable upon reading and understanding of the accompanying drawings and described embodiments, and the described embodiments are merely some rather than all of the embodiments of the present disclosure.

Embodiments of the present disclosure provide an interdigitated back contact cell. The interdigitated back contact cell includes a substrate, the substrate includes a front side and a back side, and the front side is arranged opposite to the back side;

along a first direction, first functional regions and second functional regions are alternately arranged on the back side of the substrate; the first direction intersects with a thickness direction of the substrate;

along a direction far away from the substrate, each of the first functional regions includes a first diffusion layer, a first dielectric layer, a first emitter, and a first electrode which are stacked;

along the direction far away from the substrate, each of the second functional regions includes a second diffusion layer, a second dielectric layer, a second emitter, and a second electrode which are stacked;

an isolation region is arranged between every adjacent first functional region and second functional region, and the first emitter is spatially isolated from one adjacent second emitter by a corresponding isolation region; and the first diffusion layer is in contact with at least one adjacent second diffusion layer in a corresponding region of a corresponding isolation region.

In the present disclosure, the front side of the substrate is the front side of the interdigitated back contact cell, namely the receiving side of sunlight; the back side of the substrate is the back side of the interdigitated back contact cell. The interdigitated back contact cell provided by the present disclosure also includes a frontside passivation layer on the front side of the substrate, which is not specifically limited in the present disclosure.

In the interdigitated back contact cell provided by the embodiments of the present disclosure, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell. Moreover, the interdigitated back contact cell provided by the present disclosure has an excellent reliability and a high cell efficiency.

In the present disclosure, the first functional region and the second functional region are alternately arranged along the first direction on the back side of the substrate; that is, under the non-edge condition, one first functional region is adjacent to two second functional regions, and one second functional region is adjacent to two first functional regions. In the present disclosure, "the first diffusion layer is in contact with at least one adjacent second diffusion layer" means that the first diffusion layer is in contact with one adjacent second diffusion layer and is spatially isolated from another adjacent second diffusion layer; or, the first diffusion layer is in contact with both of adjacent second diffusion layers.

In the present disclosure, "the first direction intersects with the thickness direction of the substrate" means that the alternating extension direction of the first functional region and the second functional region intersects with the thickness direction of the substrate. In some embodiments, the first direction may be perpendicular to the thickness direction of the substrate.

The substrate of the interdigitated back contact cell provided by the present disclosure is a conventional doped monocrystalline silicon substrate of an IBC cell in the art, which is not specifically limited in the present disclosure.

In some embodiments, the thickness of the first diffusion layer is from 20 nm to 100 nm, and the thickness of the second diffusion layer is from 20 nm to 100 nm. The thickness of the first diffusion layer and the thickness of the second diffusion layer may be respectively and independently 20 nm, 30 nm, 40 nm, 50 nm, 60 nm, 70 nm, 80 nm, 90 nm, 100 nm, or other values within the numerical range, which is not limited here. In some embodiments, the thickness of the first diffusion layer and the thickness of the second diffusion layer may be respectively and independently from 50 nm to 80 nm.

As a general arrangement in the technical field of the present disclosure, the thickness of the first diffusion layer is the same as, or similar to, the thickness of the second diffusion layer. In the present disclosure, "the first diffusion layer is in contact with at least one adjacent second diffusion layer in a corresponding region of a corresponding isolation region" means that the first diffusion layer is in complete contact with the second diffusion layer; or the isolation region partially sinks into the first diffusion layer and the second diffusion layer, so that the thickness of the contact region between the first diffusion layer and the second diffusion layer is less than the thickness of the first diffusion layer.

In some embodiments, the width of the isolation region is from 1 μm to 100 μm. The width of the isolation region may be 1 μm, 10 μm, 20 μm, 30 μm, 50 μm, 60 μm, 80 μm, 100 μm, or other values within the numerical range, which is not limited here.

In the present disclosure, the cross-sectional shape of the isolation region is not specifically limited. The cross-sectional shape of the isolation region can be any shape, so long as the first emitter can be spatially isolated from the second emitter, and the first diffusion layer can be in contact with at least one adjacent second diffusion layer in the corresponding region of the corresponding isolation region.

In some embodiments, the sidewall direction of the isolation region is perpendicular to the first direction; or the sidewall of the isolation region is obliquely arranged (as shown in FIG. 1). "The sidewall of the isolation region is obliquely arranged" means that the width of the end of the isolation region close to the substrate is different from the width of the end of the isolation region away from the substrate. In general, if the width of the isolation region is too small, the difficulty of manufacturing process will increase, thereby being unable to prepare structure smoothly; if the width of the isolation region is excessive, the cell efficiency will be reduced. Therefore, in the present disclosure, the width of the isolation region cannot be more than 100 μm, the width of the isolation region may be 10 μm, 20 μm, 30 μm, 50 μm, 60 μm, 80 μm, 100 μm, or other values within the numerical range, which is not limited here.

Figure 2:
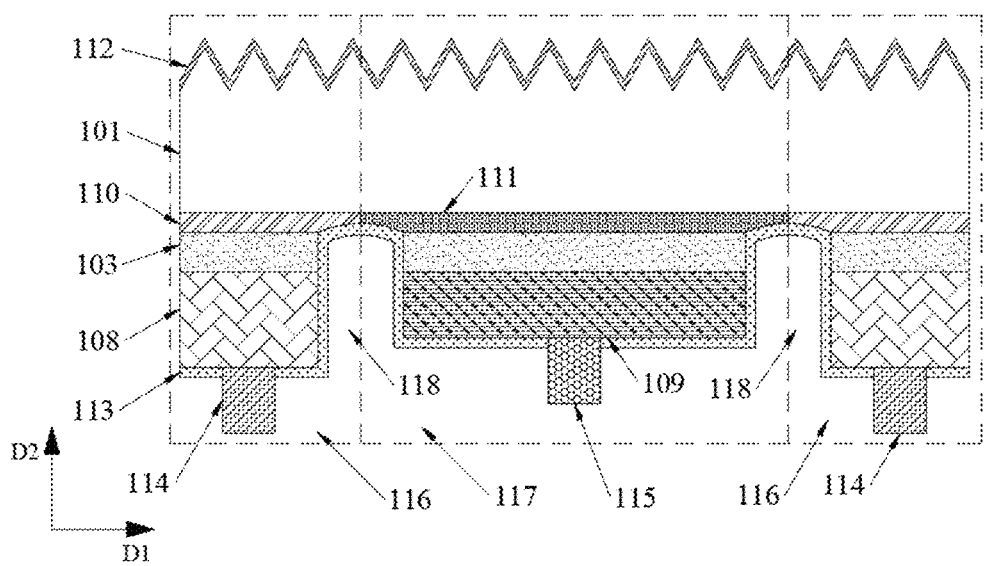
FIG. 2 is a schematic diagram of an interdigitated back contact cell according to another embodiment of the present disclosure.

In some embodiments, the end surface of the isolation region close to the substrate is parallel to the first direction, or the cross-sectional shape of the end surface is an arc (as shown in FIG. 2), a triangle, or other regular shape. In the present disclosure, the cross-sectional shape of the end surface can be any other shape, so long as the first emitter can be spatially isolated from the second emitter, and the first diffusion layer can be in contact with at least one adjacent second diffusion layer in the corresponding region of the corresponding isolation region.

Considering the feasibility of the manufacturing process, in some embodiments, the sidewall direction of the isolation region is perpendicular to the first direction, and the end surface of the isolation region close to the substrate is parallel to the first direction. In some embodiments, the width of the isolation region may be from 30 μm to 100 μm. In some embodiments, the width of the isolation region may be 30 μm, 40 μm, 50 μm, 60 μm, 70 μm, 80 μm, 90 μm, 100 μm, or other values within the numerical range, which is not limited here.

When the width of the isolation region is too small, the difficulty of manufacturing process will increase, thereby being unable to prepare structure smoothly; when the width of the isolation region is excessive, the area of the diffusion region will be reduced, and the cell efficiency will be reduced.

In some embodiments, the doping concentration of the first diffusion layer is different from the doping concentration of the second diffusion layer.

In the present disclosure, the doping concentration of the first diffusion layer is different from the doping concentration of the second diffusion layer.

In some embodiments, the first diffusion layer is a P-type doped diffusion layer, the surface doping concentration of the first diffusion layer is 1e19 cm$^{-3}$ to 4e19 cm$^{-3}$, In some embodiments, the surface doping concentration of the first diffusion layer may be 1e19 cm$^{-3}$, 1.5e19 cm$^{-3}$, 2e19 cm$^{-3}$, 2.5e19 cm$^{-3}$, 3e19 cm$^{-3}$, 3.5e19 cm$^{-3}$, 4e19 cm$^{-3}$, or other values within the numerical range, which is not limited here.

In some embodiments, the second diffusion layer is an N-type doped diffusion layer, the surface doping concentration of the second diffusion layer is 8e19 cm$^{-3}$ to 1e20 cm$^{-3}$, for example, the surface doping concentration of the second diffusion layer may be 8e19 cm$^{-3}$, 8.5e19 cm$^{-3}$, 9e19 cm$^{-3}$, 9.5e19 cm$^{-3}$, 1e20 cm$^{-3}$, or other values within the numerical range, which is not limited here.

In some embodiments, a passivation layer is arranged on surfaces of the first emitter, the isolation region, and the second emitter;
the first electrode passes through the passivation layer and comes into contact with the first emitter;
the second electrode passes through the passivation layer and comes into contact with the second emitter.

In some embodiments, the passivation layer in the present disclosure includes at least one passivation film layer. The passivation film layer includes any one of the aluminum oxide layer, the silicon nitride layer, and the silicon oxide layer. In the present disclosure, the materials of the passivation film layers in the passivation layer are the same or different, so long as the passivation effect can be achieved.

In some embodiments, the interdigitated back contact cell provided by the present disclosure further includes a frontside passivation layer on the front side of the substrate. The frontside passivation layer includes at least one frontside passivation film layer. The frontside passivation film layer includes any one of the aluminum oxide layer, the silicon nitride layer, and the silicon oxide layer. In the present disclosure, the materials of the frontside passivation film layers in the frontside passivation layer are the same or different, so long as the passivation effect can be achieved.

In some embodiments, the doping polarity of the first diffusion layer is the same as the doping polarity of the first emitter;
the doping polarity of the second diffusion layer is the same as the doping polarity of the second emitter;
and the doping polarity of the first emitter is opposite to the doping polarity of the second emitter.

In some embodiments, the first diffusion layer is a P-type doped diffusion layer, the first emitter is a P-type doped emitter, the surface doping concentration of the first emitter is 5e19 cm$^{-3}$ to 7e19 cm$^{-3}$. In some embodiments, the surface doping concentration of the first emitter may be 5e19 cm$^{-3}$, 5.5e19 cm$^{-3}$, 6e19 cm$^{-3}$, 6.5e19 cm$^{-3}$, 7e19 cm$^{-3}$, or other values within the numerical range, which is not limited here.

In some embodiments, the second diffusion layer is an N-type doped diffusion layer, the second emitter is an N-type doped emitter, the surface doping concentration of the second emitter is 2e19 cm$^{-3}$ to 4e20 cm$^{-3}$. In some embodiments, the surface doping concentration of the second emitter may be 2e19 cm$^{-3}$, 2.5e19 cm$^{-3}$, 3e19 cm$^{-3}$, 3.5e19 cm$^{-3}$, 4e20 cm$^{-3}$, or other values within the numerical range, which is not limited here.

In some embodiments, the material of the first emitter is doped polysilicon, the material of the second emitter is doped polysilicon;
the material of the first diffusion layer is doped crystalline silicon, and the material of the second diffusion layer is doped crystalline silicon.

In some embodiments, the thickness of the first dielectric layer is from 1 nm to 2 nm, and the thickness of the second dielectric layer is from 1 nm to 2 nm. In some embodiments, the thickness of the first dielectric layer and the thickness of the second dielectric layer may be respectively and independently 1 nm, 1.2 nm, 1.5 nm, 1.6 nm, 1.8 nm, 2 nm, or other values within the numerical range, which is not limited here.

In some embodiments, the thickness of the first emitter is from 200 nm to 400 nm. In some embodiments, the thickness of the first emitter may be 200 nm, 250 nm, 300 nm, 350 nm, 400 nm, or other values within the numerical range, which is not limited here.

In some embodiments, the thickness of the second emitter is from 200 nm to 400 nm. In some embodiments, the thickness of the second emitter may be 200 nm, 250 nm, 300 nm, 350 nm, 400 nm, or other values within the numerical range, which is not limited here.

In some embodiments, the thickness of the first emitter is different from the thickness of the second emitter. In some embodiments, in order to meet the requirements of high-efficiency cell structure, the thickness of the P-type doped emitter is greater than the thickness of the N-type doped emitter.

Some embodiments of the present disclosure provide a method for manufacturing an interdigitated back contact cell. The method for manufacturing an interdigitated back contact cell includes:
forming, on a back side of a substrate, first functional regions and second functional regions which are alternately arranged along a first direction; where the first direction intersects with a thickness direction of the substrate; along a direction far away from the substrate, each of the first functional regions includes a first diffusion layer, a first dielectric layer, a first emitter and a first electrode which are stacked; along the direction far away from the substrate, each of the second functional regions includes a second diffusion layer, a second dielectric layer, a second emitter and a second electrode which are stacked;
forming an isolation region between every adjacent first functional region and second functional region; where the first emitter is spatially isolated from one adjacent second emitter by a corresponding isolation region; and the first diffusion layer is in contact with at least one adjacent second diffusion layer in a corresponding region of a corresponding isolation region.

The method for manufacturing an interdigitated back contact cell provided by the embodiments of the present disclosure has a simple process. In the interdigitated back contact cell produced by the manufacture method, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell.

In some embodiments, the doping polarity of the first diffusion layer is the same as the doping polarity of the first emitter;

the doping polarity of the second diffusion layer is the same as the doping polarity of the second emitter;

and the doping polarity of the first emitter is opposite to the doping polarity of the second emitter.

In some embodiments, the substrate is an N-type silicon substrate, the first emitter is a P-type doped emitter, and the second emitter is an N-type doped emitter, and the method for manufacturing an interdigitated back contact cell includes the following steps.

(1) Form a mask layer on the front and back sides of the substrate, remove the mask layer on the back side, and then polish the back side of the substrate.

(2) Along a direction away from the front side of the substrate, successively form a tunneling layer, an intrinsic microcrystalline amorphous mixed layer, a doped film layer and a first protective film layer, on the back side of the substrate.

(3) Divide the first functional region and the second functional region; and remove the first protective film layer, the doped film layer and part of the intrinsic microcrystalline amorphous mixed layer, in the second functional region.

(4) Diffuse the doping element of the doped film layer in the first functional region into the intrinsic microcrystalline amorphous mixed layer, so that the intrinsic microcrystalline amorphous mixed layer is crystallized into polysilicon; where the intrinsic microcrystalline amorphous mixed layer in the first functional region is transformed into a polysilicon layer doped with the first element, and the intrinsic microcrystalline amorphous mixed layer in the second functional region is transformed into an undoped polysilicon layer;

form a first diffusion layer on the side of the tunneling layer of the first functional region close to the substrate, when the doping source in the polysilicon layer doped with the first element passes through the tunneling layer and diffuses to the substrate;

dope the undoped polysilicon layer with the second element, to form a polysilicon layer doped with the second element;

form a second diffusion layer on the side of the tunneling layer of the second functional region close to the substrate, when the doping source in the polysilicon layer doped with the second element passes through the tunneling layer and diffuses to the substrate.

(5) Form a second protective film layer, on the surface of the first protective film layer in the first functional region and on the surface of the polysilicon layer doped with the second element.

(6) Arrange isolation regions in the first diffusion layer and the second diffusion layer, and remove the second protective film layer in the corresponding region of the isolation region;

if the first diffusion layer contacts with the second diffusion layer in the corresponding region of the isolation region, the polysilicon layer doped with the first element and the polysilicon layer doped with the second element, in the corresponding region of the isolation region, are removed; then the second protective film layer, the first protective film layer, the doped film layer, the tunneling layer exposed in the isolation region, and the frontside mask layer are removed;

if the first diffusion layer is spatially isolated from the second diffusion layer in the corresponding region of the isolation region, the polysilicon layer doped with the first element and the polysilicon layer doped with the second element, in the corresponding region of the isolation region, are removed; then the tunneling layer, the first diffusion layer and the second diffusion layer which are exposed in the isolation region are removed in sequence; then the second protective film layer, the first protective film layer, the doped film layer and the frontside mask layer are removed.

(7) Deposit a backside passivation layer and a frontside passivation layer.

(8) Arrange a first electrode in the region of the passivation layer corresponding to the first emitter; and arrange a second electrode in the region of the passivation layer corresponding to the second emitter; and then perform a sintering treatment; where during the sintering treatment, the first electrode burns through the passivation layer and contacts the first emitter without penetrating the tunneling layer;

during the sintering treatment, the second electrode burns through the passivation layer and contacts the second emitter without penetrating the tunneling layer;

the first emitter is a polysilicon layer doped with a first element, and the second emitter is a polysilicon layer doped with a second element.

Finally, the tunneling layer in the first functional region is the first dielectric layer; and the tunneling layer in the second functional region is the second dielectric layer.

In some embodiments, the mask layer in step (1) includes a $SiO_2$ layer.

In some embodiments, the method for forming the mask layer in step (1) is but not limited to thermal oxidation, so long as the mask layer can be formed on the front and back sides of the substrate.

In some embodiments, the method for removing the mask layer on the back side in step (1) includes but is not limited to a removing treatment with a single-sided cleaning machine.

In some embodiments, the polishing treatment in step (1) includes but is not limited to a polishing treatment with an alkaline solution, so long as the reflectivity of the back side is more than 30%.

In some embodiments, the method for forming the tunneling layer in step (2) includes but is not limited to thermal oxidation.

In some embodiments, the method for forming the intrinsic microcrystalline amorphous mixed layer in step (2) includes but is not limited to a low-pressure chemical vapor deposition method (LPCVD).

In some embodiments, the method for forming the doped film layer in step (2) includes but is not limited to atmospheric pressure chemical vapor deposition (APCVD).

The doping elements in the doped film layer include boron or phosphorus.

In some embodiments, the method for forming the first protective film layer in step (2) includes but is not limited to atmospheric pressure chemical vapor deposition.

The present disclosure does not limit the specific composition and the specific thickness of the first protective film layer, so long as the intrinsic microcrystalline amorphous mixed layer and the doped film layer in the first functional region can be protected, when part of the intrinsic microcrystalline amorphous mixed layer in the second functional region is removed.

In some embodiments, the method for removing the first protective film layer and the doped film layer in the second functional region in step (3) includes but is not limited to removing treatment with a picosecond laser.

Taking the thickness of the intrinsic microcrystalline amorphous mixed layer in the second functional region as 100%, the "part" in step (3) means that a certain thickness of the intrinsic microcrystalline amorphous mixed layer in the second functional region is removed, and the removed thickness is less than 100%.

In some embodiments, the method for removing a portion of the intrinsic microcrystalline amorphous mixed layer in the second functional region in step (3) includes but is not limited to removing treatment with an alkaline solution.

In some embodiments, in step (4), the method for diffusing the doping element of the doped film layer in the first functional region into the intrinsic microcrystalline amorphous mixed layer includes but is not limited to promoting doping by increasing the temperature. The method for doping the undoped polysilicon layer includes but is not limited to doping with a gas containing the second element.

The first element is boron or phosphorus, and the second element is boron or phosphorus, and the first element is different from the second element. That is, when the first element is boron, the second element is phosphorus; or, when the first element is phosphorus, the second element is boron.

In the present disclosure, the specific composition and the specific thickness of the second protective film layer are not limited, so long as the unexposed first and second emitters can be protected in the subsequent manufacturing process.

In some embodiments, in step (6), the method for removing the second protective film layer in the corresponding region of the isolation region includes but is not limited to acid etching and/or laser etching, so long as the second protective film layer in the corresponding region of the isolation region can be removed.

In some embodiments, in step (6), the method for removing the polysilicon layer doped with the first element in the corresponding region of the isolation region includes etching with an alkaline solution containing a polishing additive.

In some embodiments, in step (6), the method for removing the polysilicon layer doped with the second element in the corresponding region of the isolation region includes etching with an alkaline solution containing a polishing additive.

In the present disclosure, the polishing additive in the alkaline solution containing additives described is a conventional polishing additive in the art, which is not limited here, so long as it can play the role of the polishing additive; the alkaline solution containing the polishing additive, which has an excellent corrosiveness to the polysilicon layer, hardly corrodes the $SiO_2$ in the tunneling layer.

In some embodiments, in step (6), the method for removing the second protective film layer, the first protective film layer, the doped film layer, the tunneling layer exposed in the isolation region, and the frontside mask layer, includes acid etching.

In some embodiments, in step (1), before forming the mask layer on the front side and back side of the substrate, the substrate is etched with alkaline etching, to remove contaminants on the substrate and to form an anti-reflection texture structure.

In the present disclosure, the alkaline solution includes but is not limited to potassium hydroxide solution, ammonium hydroxide solution, or tetramethylammonium hydroxide solution, so long as it can play the corresponding etching role, which is not limited here.

Embodiment 1

This embodiment provides an interdigitated back contact cell which includes a substrate 101, the substrate 101 includes a front side and a back side which are opposite to each other; the substrate 101 is an N-type monocrystalline silicon substrate 101.

A frontside passivation layer 112 is arranged on the front side of the substrate 101, and the material of the frontside passivation layer 112 is aluminum oxide.

Along the first direction, the first functional regions 116 and the second functional regions 117 are alternately arranged on the back side of the substrate 101; the first direction intersects with the thickness direction of the substrate 101.

Along a direction far away from the substrate 101, each of the first functional regions 116 includes a first diffusion layer 110, a first dielectric layer, a first emitter 108, and a first electrode 114 which are stacked.

Along a direction far away from the substrate 101, each of the second functional regions 117 includes a second diffusion layer 111, a second dielectric layer, a second emitter 109, and a second electrode 115 which are stacked.

A first isolation region 118 with a width of 60 μm is arranged between the first functional region 116 and the adjacent second functional region 117. The first isolation region 118 spatially isolates the first emitter 108 from the corresponding second emitter 109, spatially isolates the first dielectric layer from the corresponding second dielectric layer, while the first diffusion layer 110 is in contact with both of adjacent second diffusion layers 111 in the corresponding regions of the first isolation regions 118.

The sidewall direction of the first isolation region 118 is perpendicular to the first direction D1 and parallel to the thickness direction of the substrate D2; and the end surface of the first isolation region 118 close to the substrate 101, which is a plane, is parallel to the first direction D1.

The thickness of the contact region between the first diffusion layer 110 and the second diffusion layer 111 is 100% of the thickness of the first diffusion layer.

A passivation layer 113 is arranged on the surfaces of the first emitter 108, the first isolation region 118, and the second emitter 109, and the material of the passivation layer 113 is aluminum oxide.

The first electrode 114 passes through the passivation layer 113 and contacts with the first emitter 108; the second electrode 115 passes through the passivation layer 113 and contacts with the second emitter 109.

The doping polarity of the first diffusion layer 110 is the same as that of the first emitter 108; the doping polarity of the second diffusion layer 111 is the same as that of the second emitter 109. The first emitter 108 and the second emitter 109 are respectively and independently doped polysilicon; the first diffusion layer 110 and the second diffusion layer 111 are respectively and independently doped crystalline silicon.

The first emitter 108 is a P-type doped emitter, and the second emitter 109 is N-type doped emitter. The surface doping concentration of the first diffusion layer 110 is 1e19 $cm^{-3}$, and the surface doping concentration of the second diffusion layer 111 is 9e19 $cm^{-3}$; the surface doping concentration of the first emitter 108 is 5e19 $cm^{-3}$, and the surface doping concentration of the second emitter 109 is 3e20 $cm^{-3}$.

The method for manufacturing the interdigitated back contact cell provided in this embodiment includes the following steps.

Figure 3:
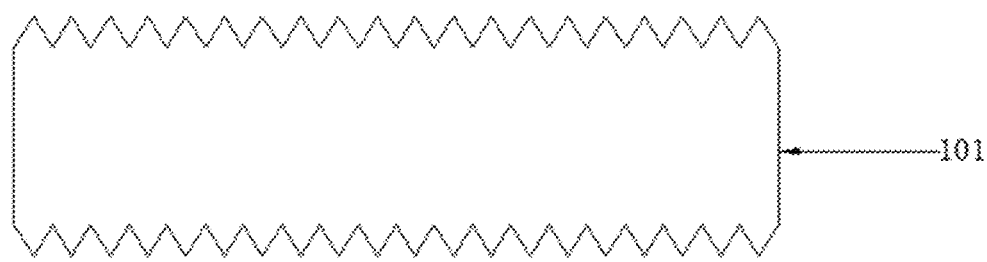
FIGS. 3 to 13 are schematic flowcharts of a method for manufacturing an interdigitated back contact cell according to Embodiment 1.
Figure 4:
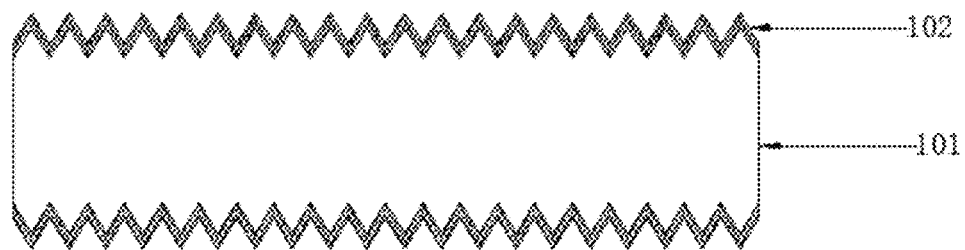
Figure 5:

(1) Etch the substrate 101 with alkaline etching, to remove contaminants on the substrate 101 and to form anti-reflection textured structure (as shown in FIG. 3); form a mask layer 102 on the front and back sides of the substrate 101 (as shown in FIG. 4); after removing the mask layer 102 on the back side with a single-sided cleaning machine, polish the back side of the substrate 101 with an alkaline solution (as shown in FIG. 5), so that the reflectivity of the back side reaches 30%.

Figure 6:
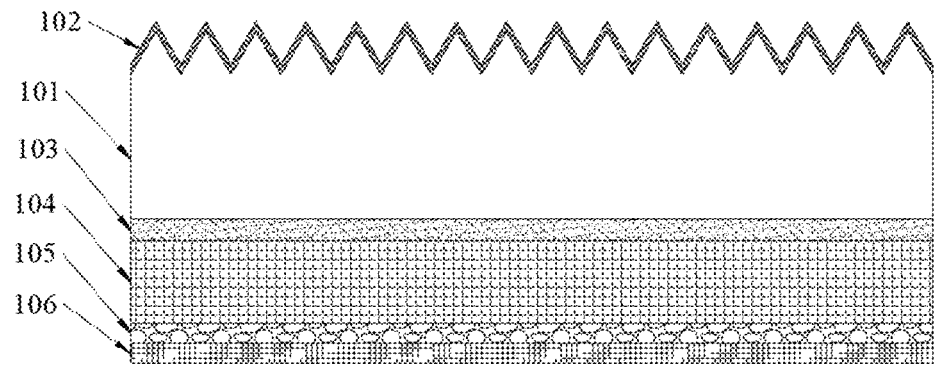

(2) Along a direction far away from the front side of the substrate 101, sequentially form a $SiO_2$ tunneling layer 103 with a thickness of 1.5 nm, an intrinsic microcrystalline amorphous mixed layer 104 with a thickness of 400 nm, a doped film layer 105 with a thickness of 50 nm, and a first protective film layer 106 with a thickness of 20 nm, on the back side of the substrate 101 (as shown in FIG. 6); where the method for forming the $SiO_2$ tunneling layer 103 is thermal oxidation;

the method for forming the intrinsic microcrystalline amorphous mixed layer 104 is LPCVD;

the method for forming the doped film layer 105 and the first protective film layer 106 is APCVD;

the doping element in the doped film layer 105 is boron.

Figure 7:
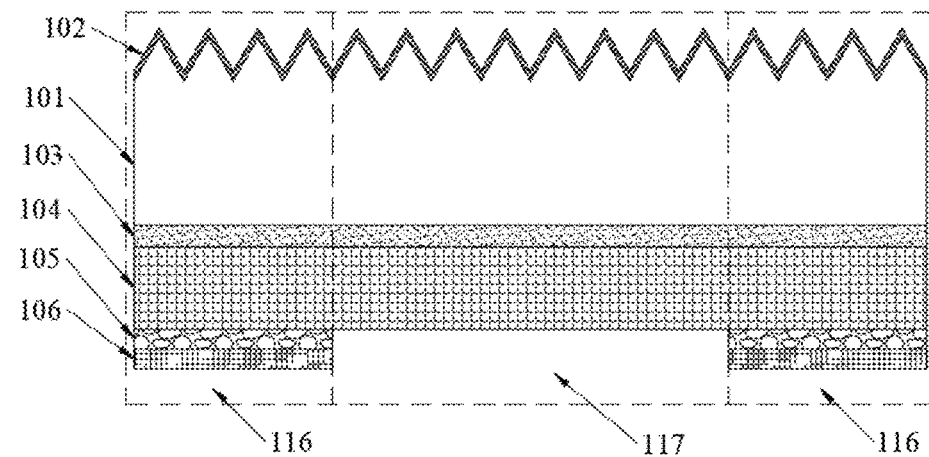
Figure 8:
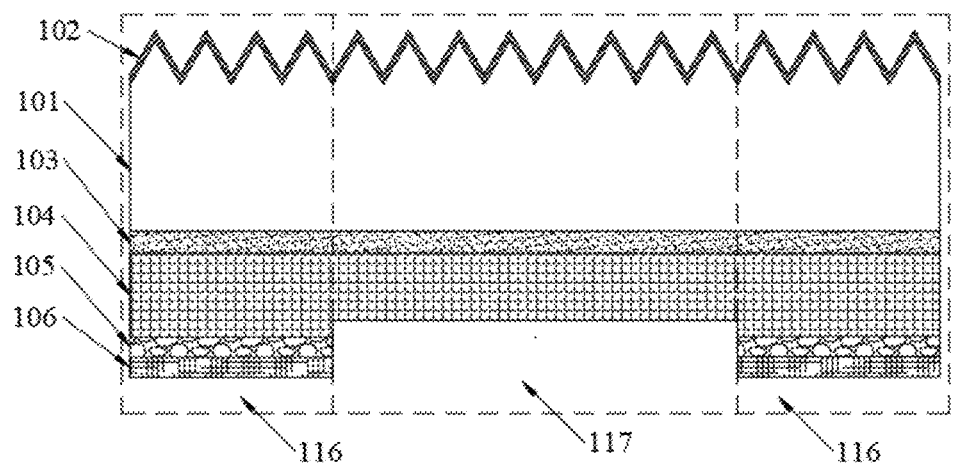

(3) Divide the first functional region 116 and the second functional region 117; and remove the first protective film layer 106, the doped film layer 105 (as shown in FIG. 7), and the intrinsic microcrystalline amorphous mixed layer 104 with a thickness of 200 nm (as shown in FIG. 8), which are in the second functional region 117;

remove, with the picosecond green laser with 50 W, the first protective film layer 106 and the doped film layer 105 in the second functional region 117;

remove, with an alkaline solution, the intrinsic microcrystalline amorphous mixed layer 104 with a thickness of 200 nm.

(4) Increase the temperature to 960° C., and execute the push-through doping treatment on the first functional region 116, so that the boron doping element of the doped film layer 105 enters into the intrinsic microcrystalline amorphous mixed layer 104, and the intrinsic microcrystalline amorphous mixed layer 104 is crystallized into polysilicon, thereby transforming the intrinsic microcrystalline amorphous mixed layer 104 in the first functional region 116 into a polysilicon layer doped with the first element, and transforming the intrinsic microcrystalline amorphous mixed layer 104 in the second functional region 117 into an undoped polysilicon layer; where the doping source of the polysilicon layer doped with the first element passes through the tunneling layer 103 and diffuses into the substrate 101, and a first diffusion layer 110 with a thickness of 60 nm is formed on one side of the tunneling layer 103 of the first functional region 116 close to the substrate 101;

reduce the temperature to 900° C., and introduce the phosphorus-containing gas (phosphorus oxychloride) into the undoped polysilicon layer, to form a polysilicon layer doped with the second element; where the doping source of the polysilicon layer doped with the second element passes through the tunneling layer 103 and diffuses into the substrate 101, and a second diffusion layer 111 with a thickness of 60 nm is formed on one side of the tunneling layer 103 of the second functional region 117 close to the substrate 101;

the first element is boron, and the second element is phosphorus.

Figure 9:
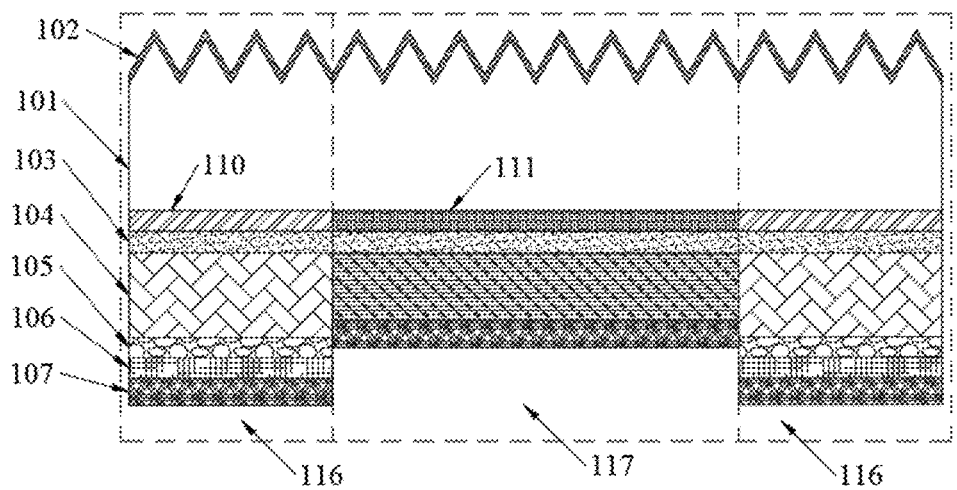

(5) Form a second protective film layer 107 with a thickness of 50 nm, on the surface of the first protective film layer 106 in the first functional region 116 and the surface of the polysilicon layer doped with the second element (as shown in FIG. 9).

Figure 10:
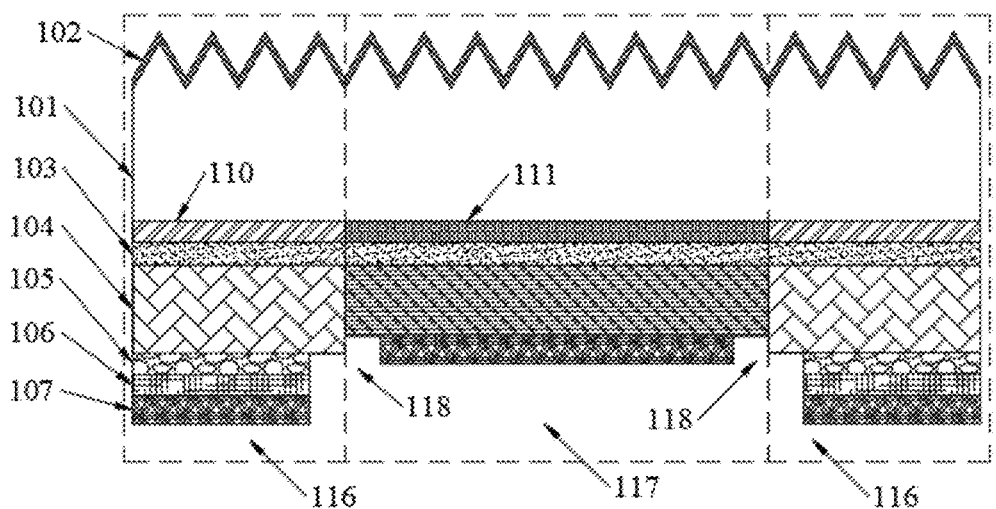
Figure 11:
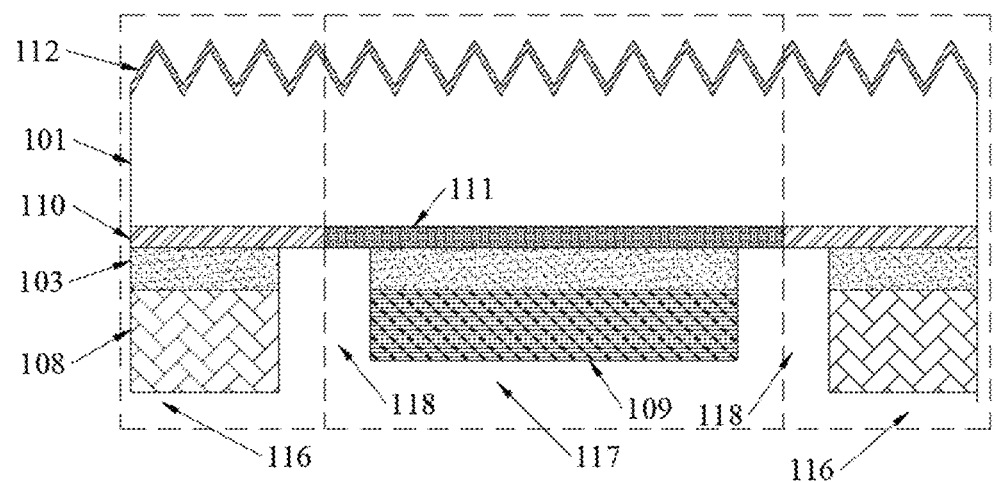

(6) Arrange the first isolation region 118 between the first diffusion layer 110 and the second diffusion layer 111; and remove the second protective film layer 107 in the corresponding region of the first isolation region 118 with laser etching (as shown in FIG. 10);

remove, with an alkaline solution containing a polishing additive, the polysilicon layer doped with the first element and the polysilicon layer doped with the second element, in the corresponding region of the first isolation region 118;

etch, with the HF solution, the second protective film layer 107, the first protective film layer 106, the doped film layer 105, the tunneling layer 103 exposed in the first isolation region 118, and the frontside mask layer 102 (as shown in FIG. 11).

Figure 12:
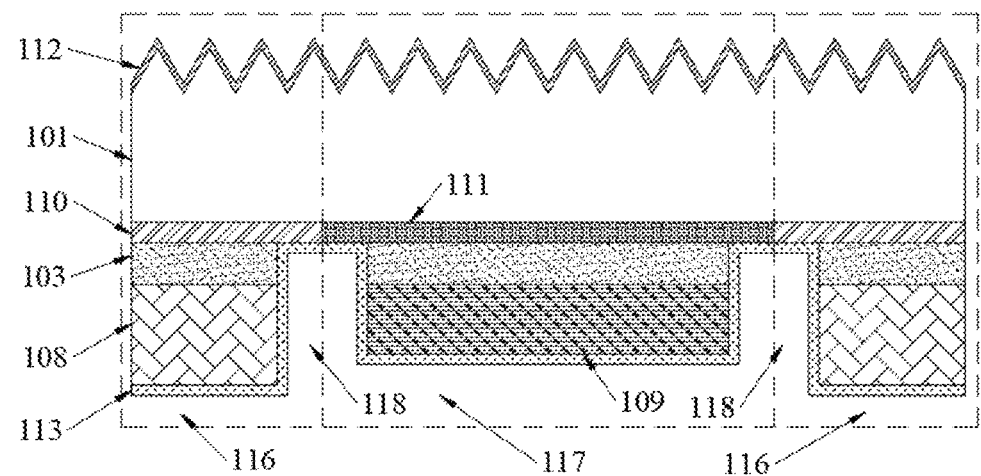

(7) Deposit the passivation layer 113 of the back side of the substrate and the frontside passivation layer 112 (as shown in FIG. 12).

Figure 13:
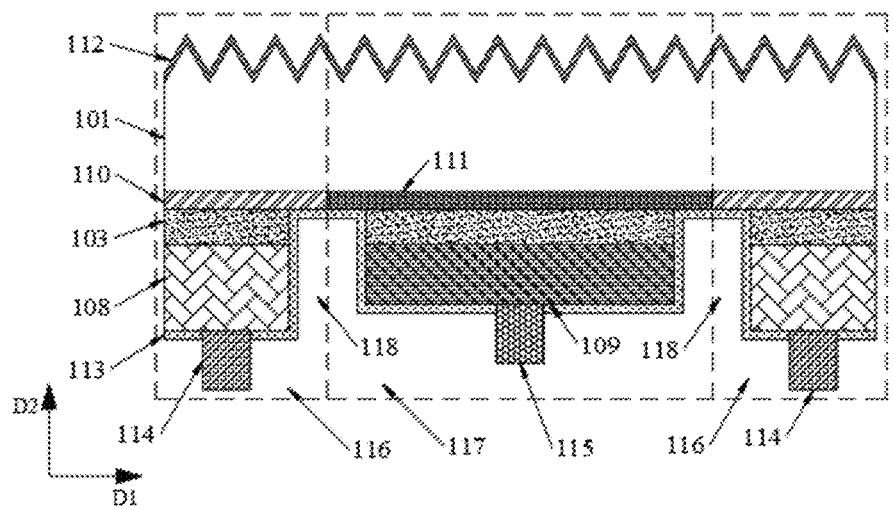

(8) Arrange the first electrode 114 in the region of the passivation layer 113 corresponding to the first emitter 108, and arrange the second electrode 115 in the region of the passivation layer 113 corresponding to the second emitter 109, and perform the sintering treatment; where during the sintering treatment, the first electrode 114 burns through the passivation layer 113 and contacts the first emitter 108 without penetrating the tunneling layer 103;

during the sintering treatment, the second electrode 115 burns through the passivation layer 113 and contacts the second emitter 109 without penetrating the tunneling layer 103 (as shown in FIG. 13);

the first emitter 108 is the polysilicon layer doped with the first element, and the second emitter 109 is the polysilicon layer doped with the second element.

Embodiment 2

This embodiment provides an interdigitated back contact cell, which is essential the same as that of Embodiment 1, except that the surface doping concentration of the first diffusion layer is 2e19 $cm^{-3}$, the surface doping concentration of the second diffusion layer is 8e19 $cm^{-3}$; the surface doping concentration of the first emitter is 6e19 $cm^{-3}$, and the surface doping concentration of the second emitter is 2e20 $cm^{-3}$.

Embodiment 3

This embodiment provides an interdigitated back contact cell, which is essential the same as that of Embodiment 1, except that the surface doping concentration of the first diffusion layer is 4e19 cm$^{-3}$, the surface doping concentration of the second diffusion layer is 1e20 cm$^{-3}$; the surface doping concentration of the first emitter is 7e19 cm$^{-3}$, the surface doping concentration of the second emitter is 4e20 cm$^{-3}$.

Embodiment 4

This embodiment provides an interdigitated back contact cell, which is essentially the same as that of Embodiment 1, except that the surface doping concentration of the first diffusion layer is 5e19 cm$^{-3}$.

Embodiment 5

This embodiment provides an interdigitated back contact cell, which is essential the same as that of Embodiment 1, except that the surface doping concentration of the second diffusion layer is 2e20 cm$^{-3}$.

Embodiment 6

This embodiment provides an interdigitated back contact cell, which is essential the same as Embodiment 1, except that the width of the first isolation region is 30 μm.

Embodiment 7

This embodiment provides an interdigitated back contact cell, which is essential the same as Embodiment 1, except that the width of the first isolation region is 100 μm.

Embodiment 8

This embodiment provides an interdigitated back contact cell, which is essentially the same as Embodiment 1, except that the width of the first isolation region is 120 μm.

Embodiment 9

This embodiment provides an interdigitated back contact cell, which is essentially the same as Embodiment 1, except that the substrate is a P-type monocrystalline silicon substrate.

Embodiment 10

This embodiment provides an interdigitated back contact cell which includes a substrate 101, the substrate 101 includes a front side and a back side which are opposite to each other; the substrate 101 is an N-type monocrystalline silicon substrate 101.

A frontside passivation layer 112 is arranged on the front side of the substrate 101, and the material of the frontside passivation layer 112 is aluminum oxide.

Along the first direction, the first functional regions 116 and the second functional regions 117 are alternately arranged on the back side of the substrate 101; the first direction intersects with the thickness direction of the substrate 101.

Along a direction far away from the substrate 101, each of the first functional region 116 includes a first diffusion layer 110, a first dielectric layer, a first emitter 108, and a first electrode 114 which are stacked.

Along a direction far away from the substrate 101, each of the second functional region 117 includes a second diffusion layer 111, a second dielectric layer, a second emitter 109, and a second electrode 115 which are stacked.

A first isolation region 118 with a width of 60 μm is arranged between the second functional region 117 and one adjacent first functional region 116. The first isolation region 118 spatially isolates the first emitter 108 from the corresponding second emitter 109, spatially isolates the first dielectric layer from the corresponding second dielectric layer, while the first diffusion layer 110 is in contact with the adjacent second diffusion layers 111 in the corresponding region of the first isolation region 118.

The sidewall direction of the first isolation region 118 is perpendicular to the first direction D1 and parallel to the thickness direction of the substrate D2; and the end surface of the first isolation region 118 close to the substrate 101, which is a plane, is parallel to the first direction D1; and the thickness of the contact region between the first diffusion layer 110 and the second diffusion layer 111 is 100% of the thickness of the first diffusion layer.

A second isolation region 119 with a width of 60 μm is arranged between the second functional region 117 and another adjacent first functional region 116. The second isolation region 119 spatially isolates the first emitter 108 from the corresponding second emitter 109, spatially isolates the first dielectric layer from the corresponding second dielectric layer, and spatially isolates the first diffusion layer 110 from the corresponding second diffusion layers 111.

The sidewall direction of the second isolation region 119 is perpendicular to the first direction D1 and parallel to the thickness direction of the substrate D2; and the end surface of the second isolation region 119 close to the substrate 101, which is a plane, is parallel to the first direction D1.

A passivation layer 113 is arranged on the surfaces of the first emitter 108, the first isolation region 118, the second isolation region 119, and the second emitter 109; and the material of the passivation layer 113 is aluminum oxide.

The first electrode 114 passes through the passivation layer 113 and contacts with the first emitter 108; the second electrode 115 passes through the passivation layer 113 and contacts with the second emitter 109.

The doping polarity of the first diffusion layer 110 is the same as that of the first emitter 108; and the doping polarity of the second diffusion layer 111 is the same as that of the second emitter 109.

The first emitter 108 and the second emitter 109 are respectively and independently doped polysilicon; the first diffusion layer 110 and the second diffusion layer 111 are respectively and independently doped crystalline silicon.

The first emitter 108 is a P-type doped emitter, and the second emitter 109 is N-type doped emitter; the surface doping concentration of the first diffusion layer 110 is 1e19 cm$^{-3}$, and the surface doping concentration of the second diffusion layer 111 is 9e19 cm$^{-3}$; the surface doping concentration of the first emitter 108 is 5e19 cm$^{-3}$, and the surface doping concentration of the second emitter 109 is 3e20 cm$^{-3}$.

The method for manufacturing the interdigitated back contact cell provided in this embodiment includes the following steps.

Figure 14:
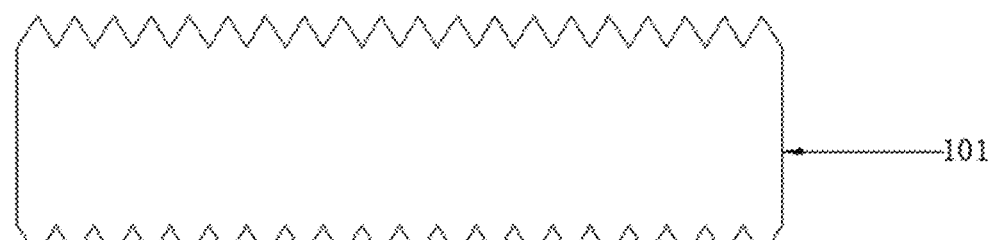
FIGS. 14 to 27 are schematic flowcharts of a method for manufacturing an interdigitated back contact cell according to Embodiment 10.
Figure 15:
Figure 16:

(1) Etch the substrate 101 with alkaline etching, to remove contaminants on the substrate 101 and to form anti-reflection textured structure (as shown in FIG. 14); form a mask layer 102 on the front and back sides of the substrate 101 (as shown in FIG. 15); after removing the mask layer 102 on the back side with a single-sided cleaning machine, polish the back side of the substrate 101 with an alkaline solution (as shown in FIG. 16), so that the reflectivity of the back side reaches 30%.

Figure 17:
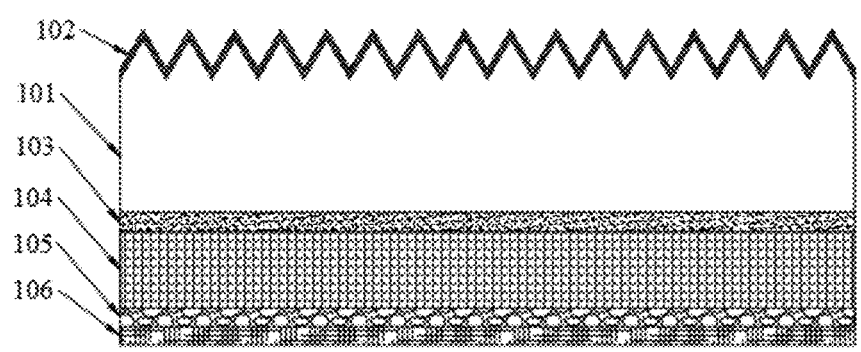

(2) Along a direction far away from the front side of the substrate 101, sequentially form a $SiO_2$ tunneling layer 103 with a thickness of 1.5 nm, an intrinsic microcrystalline amorphous mixed layer 104 with a thickness of 400 nm, a doped film layer 105 with a thickness of 50 nm, and a first protective film layer 106 with a thickness of 20 nm, on the back side of the substrate 101 (as shown in FIG. 17); where the method for forming the $SiO_2$ tunneling layer 103 is thermal oxidation;

the method for forming the intrinsic microcrystalline amorphous mixed layer 104 is LPCVD;

the method for forming the doped film layer 105 and the first protective film layer 106 is APCVD;

the doping element in the doped film layer 105 is boron.

Figure 18:
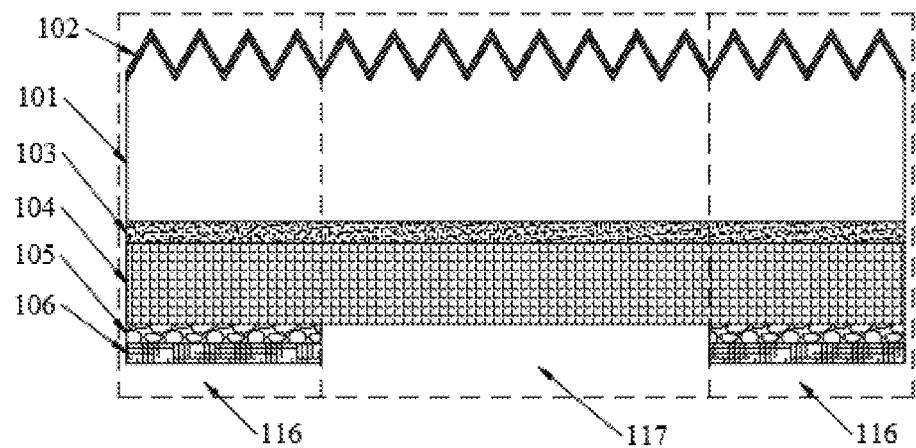
Figure 19:
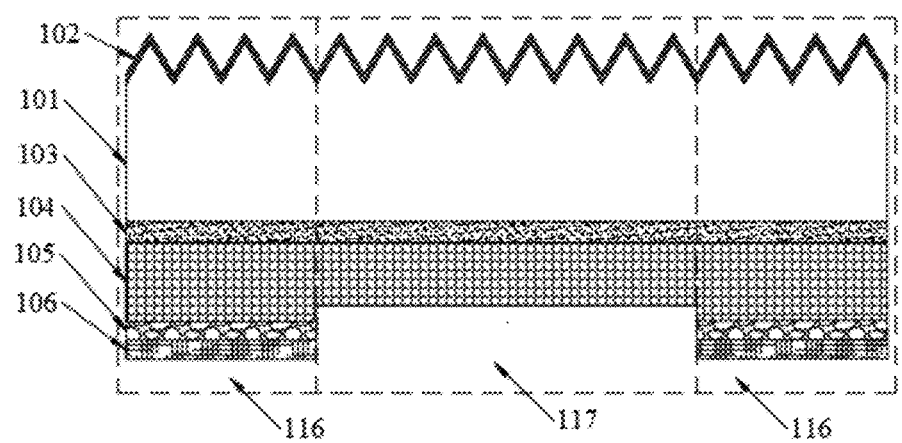

(3) Divide the first functional region 116 and the second functional region 117; and remove the first protective film layer 106, the doped film layer 105 (as shown in FIG. 18) and the intrinsic microcrystalline amorphous mixed layer 104 with a thickness of 200 nm, which are in the second functional region 117 (as shown in FIG. 19);

remove, with the picosecond green laser with 50 W, the first protective film layer 106 and the doped film layer 105 in the second functional region 117;

removed, with an alkaline solution, the intrinsic microcrystalline amorphous mixed layer 104 with a thickness of 200 nm.

(4) Increase the temperature to 960° C., and execute the push-through doping treatment on the first functional region 116, so that the boron doping element of the doped film layer 105 enters into the intrinsic microcrystalline amorphous mixed layer 104, and the intrinsic microcrystalline amorphous mixed layer 104 is crystallized into polysilicon, thereby transforming the intrinsic microcrystalline amorphous mixed layer 104 in the first functional region 116 into a polysilicon layer doped with the first element, and transforming the intrinsic microcrystalline amorphous mixed layer 104 in the second functional region 117 into an undoped polysilicon layer; where the doping source of the polysilicon layer doped with the first element passes through the tunneling layer 103 and diffuses into the substrate 101, and a first diffusion layer 110 with a thickness of 60 nm is formed on one side of the tunneling layer 103 of the first functional region 116 close to the substrate 101;

reduce the temperature to 900° C., and introduce phosphorus-containing gas (phosphorus oxychloride) into the undoped polysilicon layer, so that a polysilicon layer is doped with the second element; where the doping source of the polysilicon layer doped with the second element passes through the tunneling layer 103 and diffuses into the substrate 101, and a second diffusion layer 111 with a thickness of 60 nm is formed on one side of the tunneling layer 103 of the second functional region 117 close to the substrate 101;

the first element is boron, and the second element is phosphorus.

Figure 20:
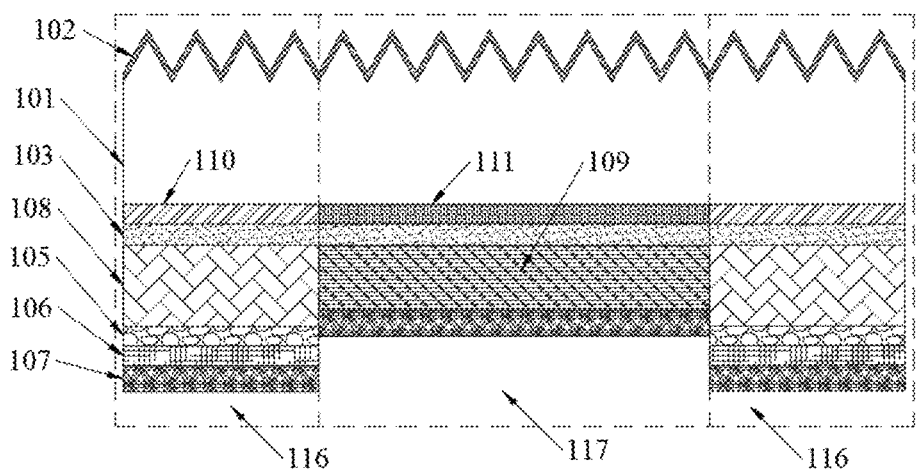

(5) Form a second protective film layer 107 with a thickness of 50 nm, on the surface of the first protective film layer 106 in the first functional region 116 and the surface of the polysilicon layer doped with the second element (as shown in FIG. 20).

Figure 21:
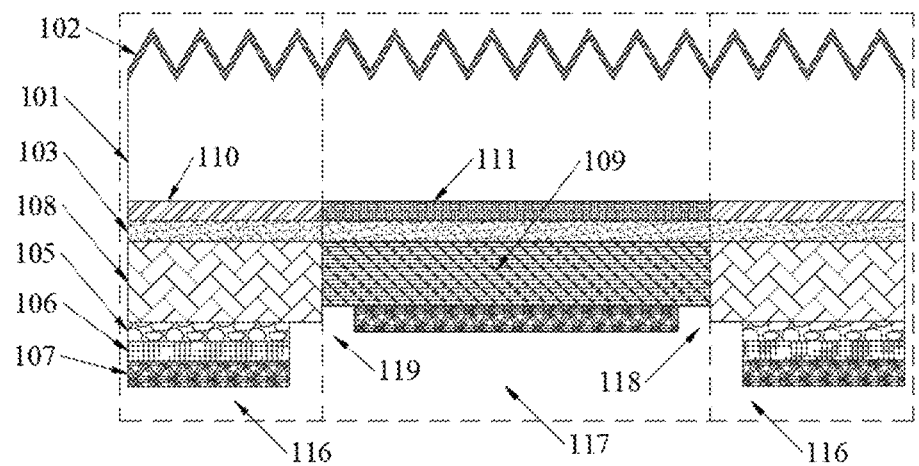
Figure 22:
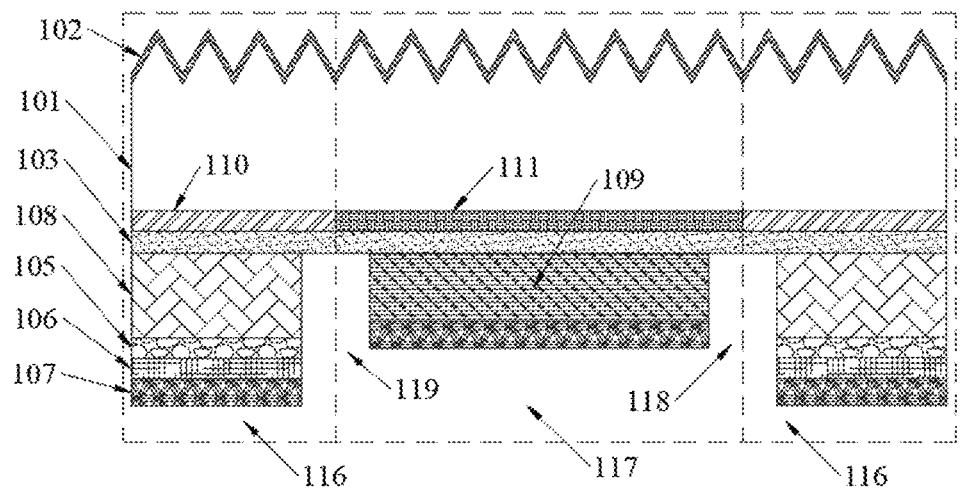
Figure 23:
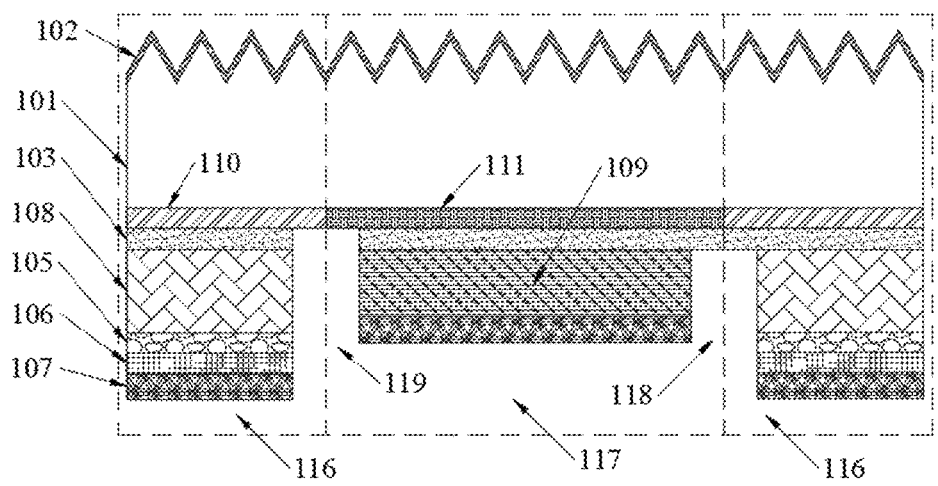
Figure 24:
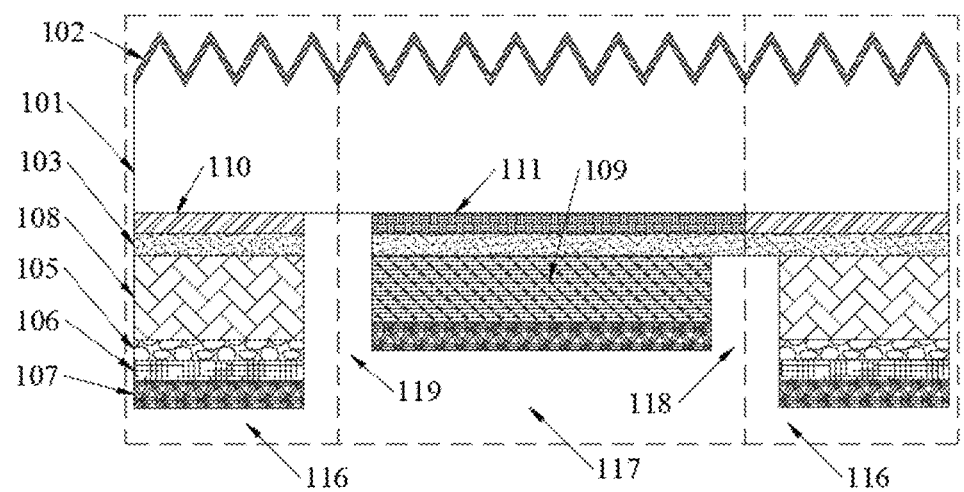
Figure 25:
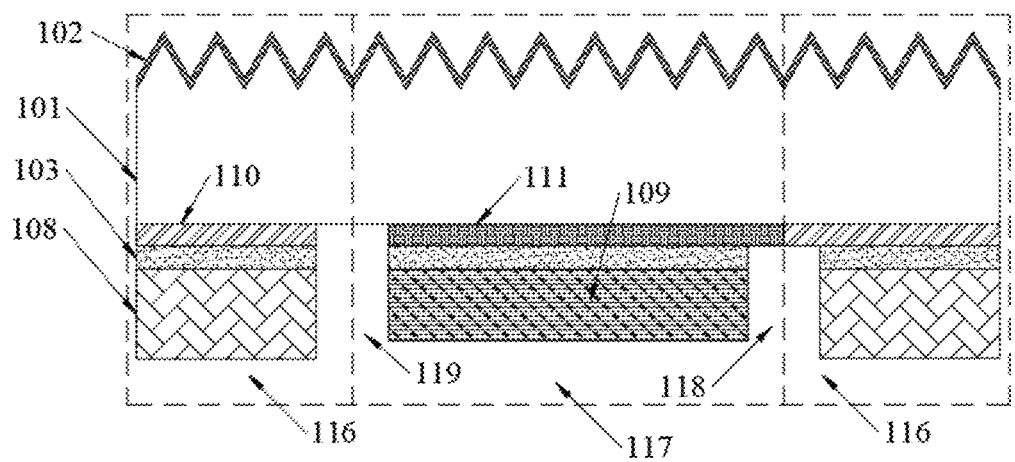

(6) Arrange the first isolation region 118 and the second isolation region 119 between the first diffusion layer 110 and the second diffusion layer 111; and remove the second protective film layer 107 which is in the corresponding region of the first isolation region 118 and the corresponding region of the second isolation region 119 with screen printing of the etching resist and acid etching (as shown in FIG. 21);

remove, with an alkaline solution containing a polishing additive, the polysilicon layer doped with the first element and the polysilicon layer doped with the second element in the corresponding region of the first isolation region 118 and the corresponding region of the second isolation region 119 (as shown in FIG. 22);

remove, with a laser etching, the tunneling layer 103 in the corresponding region of the second isolation region 119, to expose the first diffusion layer 110 and the second diffusion layer 111 in the corresponding region (as shown in FIG. 23);

remove, with an alkaline solution containing a polishing additive, the first diffusion layer 110 and the second diffusion layer 111 in the corresponding region of the second isolation region 119, so that the layers are completely and spatially isolated by the second isolation region 119 (as shown in FIG. 24);

etch, with an HF solution, the second protective film layer 107, the first protective film layer 106, the doped film layer 105, the tunneling layer 103 exposed in the first isolation region 118, and the frontside mask layer 102 (as shown in FIG. 25).

Figure 26:
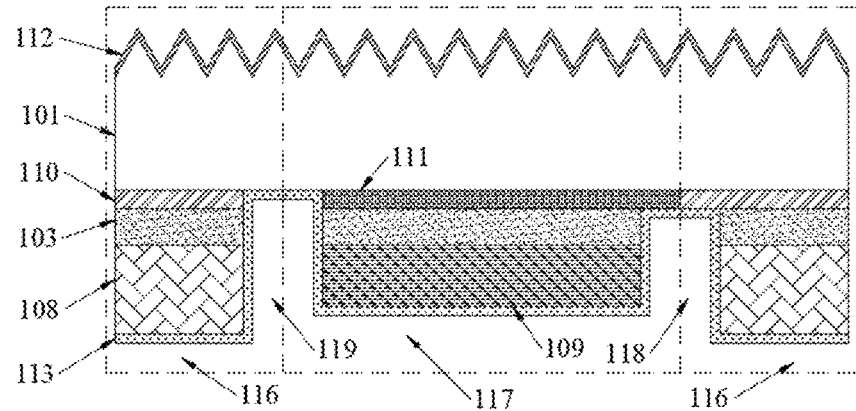

(7) Deposit the passivation layer 113 of the back side of the substrate and the frontside passivation layer 112 (as shown in FIG. 26).

Figure 27:
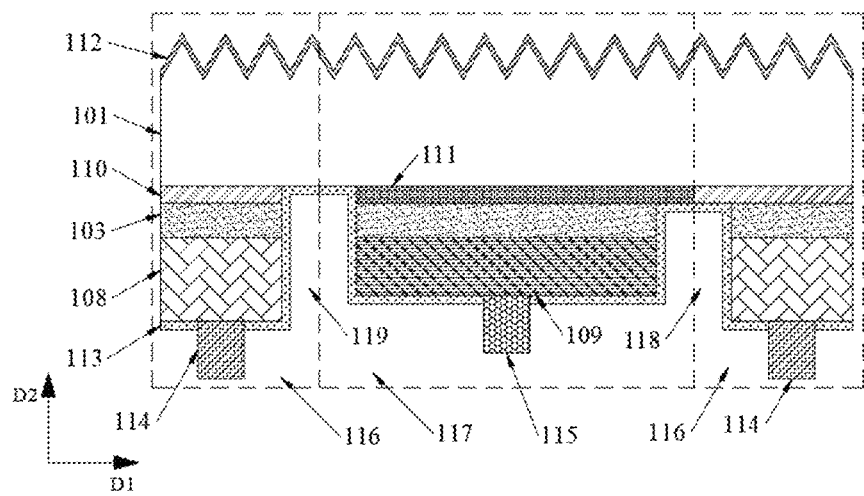

(8) Arrange the first electrode 114 in the region of the passivation layer 113 corresponding to the first emitter 108, and arrange the second electrode 115 in the region of the passivation layer 113 corresponding to the second emitter 109, and perform the sintering treatment; where during the sintering treatment, the first electrode 114 burns through the passivation layer 113 and contacts the first emitter 108 without penetrating the tunneling layer 103;

during the sintering treatment, the second electrode 115 burns through the passivation layer 113 and contacts the second emitter 109 without penetrating the tunneling layer 103 (as shown in FIG. 27);

the first emitter 108 is the polysilicon layer doped with the first element boron, and the second emitter 109 is the polysilicon layer doped with the second element phosphorus.

Embodiment 11

This embodiment provides an interdigitated back contact cell, which is essential the same as that of Embodiment 10, except that the surface doping concentration of the first diffusion layer is 2e19 $cm^{-3}$, the surface doping concentration of the second diffusion layer is 8e19 $cm^{-3}$; the surface doping concentration of the first emitter is 6e19 $cm^{-3}$, and the surface doping concentration of the second emitter is 2e20 $cm^{-3}$.

Embodiment 12

This embodiment provides an interdigitated back contact cell, which is essential the same as that of embodiment 10, except that the surface doping concentration of the first diffusion layer is 4e19 cm$^{-3}$, the surface doping concentration of the second diffusion layer is 1e20 cm$^{-3}$; the surface doping concentration of the first emitter is 7e19 cm$^{-3}$, and the surface doping concentration of the second emitter is 4e20 cm$^{-3}$.

Embodiment 13

This embodiment provides an interdigitated back contact cell, which is essential the same as that of embodiment 10, except that the surface doping concentration of the first diffusion layer is 5e19 cm$^{-3}$.

Embodiment 14

This embodiment provides an interdigitated back contact cell, which is essential the same as that of embodiment 10, except that the surface doping concentration of the second diffusion layer is 2e20 cm$^{-3}$.

Embodiment 15

This embodiment provides an interdigitated back contact cell, which is essential the same as that of embodiment 10, except that the width of the first isolation region and the width of the second isolation region are respectively and independently 30 μm.

Embodiment 16

This embodiment provides an interdigitated back contact cell, which is essential the same as that of embodiment 10, except that the width of the first isolation region and the width of the second isolation region are respectively and independently 100 μm.

Embodiment 17

This embodiment provides an interdigitated back contact cell, which is essential the same as that of Embodiment 10, except that the width of the first isolation region and the width of the second isolation region are respectively and independently 120 μm.

Embodiment 18

This embodiment provides an interdigitated back contact cell, which is essential the same as Embodiment 10, except that the substrate is a P-type monocrystalline silicon substrate.

Comparative Example 1

Figure 28:
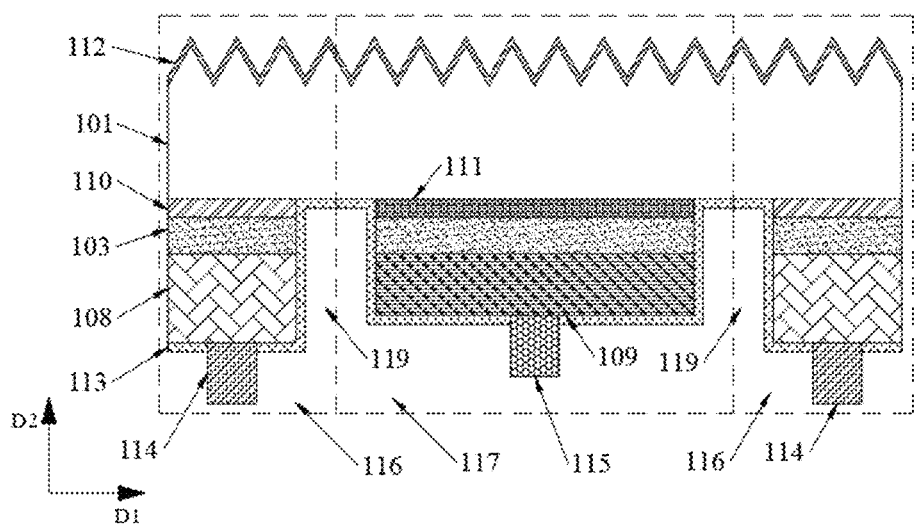
FIG. 28 is a schematic diagram of an interdigitated back contact cell according to Comparative Example 1.

This comparative example provides an interdigitated back contact cell as shown in FIG. 28. The interdigitated back contact cell includes a substrate 101, the substrate 101 includes a front side and a back side which are opposite to each other; the substrate 101 is an N-type monocrystalline silicon substrate 101.

A frontside passivation layer 112 is arranged on the front side of the substrate 101, and the material of the frontside passivation layer 112 is aluminum oxide.

Along the first direction, the first functional regions 116 and the second functional regions 117 are alternately arranged on the back side of the substrate 101; the first direction intersects with the thickness direction of the substrate 101.

Along a direction far away from the substrate 101, each of the first functional region 116 includes a first diffusion layer 110, a first dielectric layer, a first emitter 108, and a first electrode 114 which are stacked.

Along a direction far away from the substrate 101, each of the second functional region 117 includes a second diffusion layer 111, a second dielectric layer, a second emitter 109, and a second electrode 115 which are stacked.

A second isolation region 119 with a width of 60 μm is arranged between the second functional region 117 and an adjacent first functional region 116. The second isolation region 119 spatially isolates the first emitter 108 from the corresponding second emitter 109, spatially isolates the first dielectric layer from the corresponding second dielectric layer, and spatially isolates the first diffusion layer 110 from the corresponding second diffusion layer 111.

The sidewall direction of the second isolation region 119 is perpendicular to the first direction D1 and parallel to the thickness direction of the substrate D2; and the end surface of the second isolation region 119 on the side close to the substrate 101, which is a plane, is parallel to the first direction D1.

A passivation layer 113 is arranged on the surfaces of the first emitter 108, the second isolation region 119, and the second emitter 109; and the material of the passivation layer 113 is aluminum oxide.

The first electrode 114 passes through the passivation layer 113 and contacts with the first emitter 108; the second electrode 115 passes through the passivation layer 113 and contacts with the second emitter 109.

The doping polarity of the first diffusion layer 110 is the same as that of the first emitter 108; the doping polarity of the second diffusion layer 111 is the same as that of the second emitter 109. The first emitter 108 and the second emitter 109 are independently doped polysilicon; the first diffusion layer 110 and the second diffusion layer 111 are independently doped crystalline silicon.

The first emitter 108 is a P-type doped emitter, and the second emitter 109 is N-type doped emitter. The doping concentration of the first diffusion layer 110 is 1e19 cm$^{-3}$, and the doping concentration of the second diffusion layer 111 is 9e19 cm$^{-3}$; the surface doping concentration of the first emitter 108 is 5e19 cm$^{-3}$, and the surface doping concentration of the second emitter 109 is 3e20 cm$^{-3}$.

The method for manufacturing the interdigitated back contact cell provided by this comparative example includes the following steps.
  (1) Etch the substrate 101 with alkaline etching, to remove contaminants on the substrate 101 and to form anti-reflection textured structure; form a mask layer 102 on the front and back sides of the substrate 101; after removing the mask layer 102 on the back side with a single-sided cleaning machine, polish the back side of the substrate 101 with an alkaline solution, so that the reflectivity of the back side reaches 30%.
  (2) Along a direction far away from the front side of the substrate 101, sequentially form a SiO$_2$ tunneling layer 103 with a thickness of 1.5 nm, an intrinsic microcrystalline amorphous mixed layer 104 with a thickness of 400 nm, a doped film layer 105 with a thickness of 50 nm, and a first protective film layer 106 with a thickness of 20 nm, on the back side of the substrate 101; where the method for forming the SiO$_2$ tunneling layer 103 is thermal oxidation;

the method for forming the intrinsic microcrystalline amorphous mixed layer 104 is LPCVD;

the method for forming the doped film layer 105 and the first protective film layer 106 is APCVD;

the doping element in the doped film layer 105 is boron.

(3) Divide the first functional region 116 and the second functional region 117, and remove the first protective film layer 106, the doped film layer 105, and the intrinsic microcrystalline amorphous mixed layer 104 with a thickness of 200 nm, which are in the second functional region 117;

remove, with the picosecond green laser with 50 W, the first protective film layer 106 and the doped film layer 105 in the second functional region 117;

remove, with an alkaline solution, the intrinsic microcrystalline amorphous mixed layer 104 with a thickness of 200 nm.

(4) Increase the temperature to 960° C., and execute the push-through doping treatment on the first functional region 116, so that the boron doping element of the doped film layer 105 enters into the intrinsic microcrystalline amorphous mixed layer 104, and the intrinsic microcrystalline amorphous mixed layer 104 is crystallized into polysilicon, thereby transforming the intrinsic microcrystalline amorphous mixed layer 104 in the first functional region 116 into a polysilicon layer doped with the first element, and transforming the intrinsic microcrystalline amorphous mixed layer 104 in the second functional region 117 into an undoped polysilicon layer; where the doping source of the polysilicon layer doped with the first element passes through the tunneling layer 103 and diffuses into the substrate 101, and a first diffusion layer 110 with a thickness of 60 nm is formed on one side of the tunneling layer 103 of the first functional region 116 close to the substrate 101;

reduce the temperature to 900° C., and introduce phosphorus-containing gas (phosphorus oxychloride) into the undoped polysilicon layer, so that a polysilicon layer is doped with the second element; where the doping source of the polysilicon layer doped with the second element passes through the tunneling layer 103 and diffuses into the substrate 101, and a second diffusion layer 111 with a thickness of 60 nm is formed on one side of the tunneling layer 103 of the second functional region 117 close to the substrate 101;

the first element is boron, and the second element is phosphorus.

(5) Form a second protective film layer 107 with a thickness of 50 nm, on the surface of the first protective film layer 106 in the first functional region 116 and the surface of the polysilicon layer doped with the second element; where a first diffusion layer 110 is formed on one side of the tunneling layer 103 of the first functional region 116 close to the substrate 101, and a second diffusion layer 111 is formed on one side of the tunneling layer 103 of the second functional region 117 close to the substrate 101 (as shown in FIG. 20).

(6) Arrange a second isolation region 119 between the first diffusion layer 110 and the second diffusion layer 111, and remove the second protective film layer 107 in the corresponding region of the isolation region with screen printing of the etching resist and acid etching;

remove, with an alkaline solution containing a polishing additive, the polysilicon layer doped with the first element and the polysilicon layer doped with the second element in the corresponding region of the second isolation region 119;

remove, with a laser etching, the tunneling layer 103 in the corresponding region of the second isolation region 119, to expose the first diffusion layer 110 and the second diffusion layer 111 in the corresponding region;

remove, with an alkaline solution containing a polishing additive, the first diffusion layer 110 and the second diffusion layer 111 in the corresponding region of the second isolation region 119, so that the layers are completely and spatially isolated by the isolation region;

etch, with an HF solution, the second protective film layer 107, the first protective film layer 106, the doped film layer 105, and the frontside mask layer 102.

(7) Deposit the passivation layer 113 of the back side of the substrate and the frontside passivation layer 112.

(8) Arrange the first electrode 114 in the region of the passivation layer 113 corresponding to the first emitter 108, and arrange the second electrode 115 in the region of the passivation layer 113 corresponding to the second emitter 109, and perform the sintering treatment; where during the sintering treatment, the first electrode 114 burns through the passivation layer 113 and contacts the first emitter 108 without penetrating the tunneling layer 103;

during the sintering treatment, the second electrode 115 burns through the passivation layer 113 and contacts the second emitter 109 without penetrating the tunneling layer 103;

the first emitter 108 is the polysilicon layer doped with a first element boron, and the second emitter 109 is the polysilicon layer doped with a second element phosphorus.

Performance Characterization

The reverse breakdown voltage and cell efficiency of the interdigitated back contact cells provided by Embodiments 1-18 and Comparative Example 1 were tested, and the results are shown in Table 1.

The test method for reverse breakdown voltage includes: applying a reverse bias to the cell, and recording the reverse bias applied when the leakage current is 10 A.

The test method for cell efficiency includes: measuring the cell IV by a halm tester, under a Reference Light Intensity of 1000 W/m and a Reference AM (Air Mass) 1.5 Spectra.

TABLE 1

| | Reverse breakdown voltage | Cell efficiency | Hot spot Reliability |
| --- | --- | --- | --- |
| Embodiment 1 | −3.0 V | 25.80% | Passed, no appearance damage on the back sheet |
| Embodiment 2 | −3.0 V | 25.75% | Passed, no appearance damage on the back sheet |
| Embodiment 3 | −2.4 V | 25.67% | Passed, no appearance damage on the back sheet |
| Embodiment 4 | −1.5 V | 25.40% | Passed, no appearance damage on the back sheet |
| Embodiment 5 | −1.8 V | 25.45% | Passed, no appearance damage on the back sheet |
| Embodiment 6 | −3.0 V | 25.80% | Passed, no appearance damage on the back sheet |
| Embodiment 7 | −3.0 V | 25.72% | Passed, no appearance damage on the back sheet |

TABLE 1-continued

| | Reverse breakdown voltage | Cell efficiency | Hot spot Reliability |
|---|---|---|---|
| Embodiment 8 | −3.0 V | 25.65% | Passed, no appearance damage on the back sheet |
| Embodiment 9 | −3.0 V | 25.30% | Passed, no appearance damage on the back sheet |
| Embodiment 10 | −4.5 V | 25.75% | Passed, no appearance damage on the back sheet |
| Embodiment 11 | −4.5 V | 25.70% | Passed, no appearance damage on the back sheet |
| Embodiment 12 | 4.0 V | 25.66% | Passed, no appearance damage on the back sheet |
| Embodiment 13 | 3.0 V | 25.40% | Passed, no appearance damage on the back sheet |
| Embodiment 14 | 3.1 V | 25.44% | Passed, no appearance damage on the back sheet |
| Embodiment 15 | 4.5 V | 25.75% | Passed, no appearance damage on the back sheet |
| Embodiment 16 | 4.5 V | 25.70% | Passed, no appearance damage on the back sheet |
| Embodiment 17 | 4.5 V | 25.64% | Passed, no appearance damage on the back sheet |
| Embodiment 18 | −4.0 V | 25.20% | Passed, no appearance damage on the back sheet |
| Comparative Example 1 | −50 V | 26.00% | Failed, the back sheet has burn-through point |

In summary, in the interdigitated back contact cell provided by the present disclosure, the first diffusion layer of the first functional region is in contact with at least one adjacent second diffusion layer of the second functional region, which helps to overcome the defects caused by a simple isolation region separating the first functional region from the second functional region. So that the reverse breakdown voltage of the interdigitated back contact cell can be reduced to a reasonable value, thereby avoiding the risk of hot spots, and improving the reliability of the interdigitated back contact cell. Moreover, the interdigitated back contact cell provided by the present disclosure has an excellent reliability and a high cell efficiency. The method for manufacturing an interdigitated back contact cell provided by the present disclosure has a simple process. And the reverse breakdown voltage of the interdigitated back contact cell formed by the manufacture method is reduced to a reasonable value, thereby avoiding the risk of hot spots, and having a higher cell efficiency.

It should be noted that the above embodiments are merely intended to explain the technical solutions of the present disclosure, rather than to limit the present disclosure. Those skilled in the art should understand that they may still make changes and modifications to the embodiments without departing from the spirit and scope of the present disclosure.

The invention claimed is:

1. An interdigitated back contact cell, comprising:
a substrate comprising a front side and a back side, the front side being arranged opposite to the back side; wherein
first functional regions and second functional regions are arranged on the back side of the substrate; the first functional regions and the second functional regions are alternately arranged in a first direction; the first direction intersects with a thickness direction of the substrate;
each of the first functional regions comprises a first diffusion layer, a first dielectric layer, a first emitter, and a first electrode which are stacked in a direction away from the substrate;
each of the second functional regions comprises a second diffusion layer, a second dielectric layer, a second emitter, and a second electrode which are stacked in a direction away from the substrate;
an isolation region is arranged between every adjacent first functional region and second functional region; and the first emitter is spatially isolated from one adjacent second emitter by a corresponding isolation region; and
the first diffusion layer is in contact with at least one adjacent second diffusion layer in a corresponding region adjacent to a corresponding isolation region.

2. The interdigitated back contact cell of claim 1, wherein a thickness of the first diffusion layer is from 20 nm to 100 nm, and a thickness of the second diffusion layer is from 20 nm to 100 nm.

3. The interdigitated back contact cell of claim 2, wherein a thickness of a contact region between the first diffusion layer and the second diffusion layer is less than or equal to the thickness of the first diffusion layer.

4. The interdigitated back contact cell of claim 1, wherein a width of the isolation region is from 1 μm to 100 μm.

5. The interdigitated back contact cell of claim 1, wherein a passivation layer is arranged on surfaces of the first emitter, the isolation region, and the second emitter;
the first electrode passes through the passivation layer and comes into contact with the first emitter;
and the second electrode passes through the passivation layer and comes into contact with the second emitter.

6. The interdigitated back contact cell of claim 5, wherein the passivation layer comprises at least one passivation film layer, and the passivation film layer comprises any one of an aluminum oxide layer, a silicon nitride layer and a silicon oxide layer.

7. The interdigitated back contact cell of claim 1, wherein a material of the first emitter is doped polysilicon, a material of the second emitter is doped polysilicon;
a material of the first diffusion layer is doped crystalline silicon, and a material of the second diffusion layer is doped crystalline silicon.

8. The interdigitated back contact cell of claim 1, wherein a thickness of the first dielectric layer is from 1 nm to 2 nm, and a thickness of the second dielectric layer is from 1 nm to 2 nm.

9. The interdigitated back contact cell of claim 1, wherein a thickness of the first emitter is from 200 nm to 400 nm; and a thickness of the second emitter is from 200 nm to 400 nm.

10. The interdigitated back contact cell of claim 1, wherein a doping concentration of the first diffusion layer is different from a doping concentration of the second diffusion layer.

11. The interdigitated back contact cell of claim 1, wherein the first diffusion layer is a P-type doped diffusion layer, and a surface doping concentration of the first diffusion layer is 1e19 $cm^{-3}$ to 4e19 $cm^{-3}$.

12. The interdigitated back contact cell of claim 1, wherein the second diffusion layer is an N-type doped diffusion layer, and a surface doping concentration of the second diffusion layer is 8e19 $cm^{-3}$ to 1e20 $cm^{-3}$.

13. The interdigitated back contact cell of claim 1, wherein the interdigitated back contact cell further comprises a frontside passivation layer on the front side of the substrate;
the frontside passivation layer comprises at least one frontside passivation film layer, and the frontside passivation film layer comprises any one of an aluminum oxide layer, a silicon nitride layer, and a silicon oxide layer.

14. The interdigitated back contact cell of claim 1, wherein
a doping polarity of the first diffusion layer is the same as a doping polarity of the first emitter;
a doping polarity of the second diffusion layer is the same as a doping polarity of the second emitter;
and the doping polarity of the first emitter is opposite to the doping polarity of the second emitter.

15. The interdigitated back contact cell of claim 1, wherein the first diffusion layer is a P-type doped diffusion layer, the first emitter is a P-type doped emitter, and a surface doping concentration of the first emitter is 5e19 $cm^{-3}$ to 7e19 $cm^{-3}$.

16. The interdigitated back contact cell of claim 1, wherein the second diffusion layer is an N-type doped diffusion layer, the second emitter is an N-type doped emitter, and a surface doping concentration of the second emitter is 2e19 $cm^{-3}$ to 4e20 $cm^{-3}$.

17. The interdigitated back contact cell of claim 1, wherein a thickness of the first emitter is different from a thickness of the second emitter.

18. The interdigitated back contact cell of claim 1, wherein a sidewall direction of the isolation region is perpendicular to the first direction; or
a sidewall of the isolation region is obliquely arranged, so that a width of an end of the isolation region close to the substrate is different from a width of an end of the isolation region away from the substrate.

19. A method for manufacturing an interdigitated back contact cell, comprising:
forming, on a back side of a substrate, first functional regions and second functional regions which are alternately arranged along a first direction; wherein, the first direction intersects with a thickness direction of the substrate; each of the first functional regions comprises a first diffusion layer, a first dielectric layer, a first emitter and a first electrode which are stacked in a direction away from the substrate; each of the second functional regions comprises a second diffusion layer, a second dielectric layer, a second emitter and a second electrode which are stacked in a direction away from the substrate;
forming an isolation region between every adjacent first functional region and second functional region; wherein, the first emitter is spatially isolated from one adjacent second emitter by a corresponding isolation region; and the first diffusion layer is in contact with at least one adjacent second diffusion layer in a corresponding region adjacent to a corresponding isolation region.

20. The method for manufacturing an interdigitated back contact cell of claim 19, wherein
a doping polarity of the first diffusion layer is the same as a doping polarity of the first emitter;
a doping polarity of the second diffusion layer is the same as a doping polarity of the second emitter;
and the doping polarity of the first emitter is opposite to the doping polarity of the second emitter.

* * * * *